United States Patent [19]

Bloomfield et al.

[11] Patent Number: 4,692,285

[45] Date of Patent: Sep. 8, 1987

[54] PROCESS OF PREPARING NONFIBROUS, PIEZOELECTRIC POLYMER SHEET OF IMPROVED ACTIVITY

[75] Inventors: Philip E. Bloomfield, Bala Cynwyd; Seymour Preis, Allentown, both of Pa.

[73] Assignee: Pennwalt Corporation, Philadelphia, Pa.

[21] Appl. No.: 750,443

[22] Filed: Jul. 1, 1985

[51] Int. Cl.⁴ .......................................... B29C 71/04
[52] U.S. Cl. ......................................... 264/22; 264/24; 264/27; 264/104; 264/235; 264/237; 264/346; 264/348
[58] Field of Search .................. 264/22, 24, 27, 235, 264/237, 346, 348

[56] References Cited

U.S. PATENT DOCUMENTS

| | | | |
|---|---|---|---|
| 3,197,538 | 7/1965 | Capron et al. | 264/235 |
| 3,707,592 | 12/1972 | Ishii et al. | 264/235 |
| 3,833,503 | 9/1974 | Murayama et al. | 252/63.7 |
| 3,878,274 | 4/1975 | Murayama et al. | 264/22 |
| 3,991,451 | 11/1976 | Maruyama et al. | 264/345 |
| 4,127,681 | 11/1978 | Ferren et al. | 264/22 |
| 4,268,653 | 5/1981 | Uchidoi et al. | 264/22 |
| 4,349,502 | 9/1982 | Pae et al. | 264/235 |
| 4,393,093 | 7/1983 | Sprout | 264/22 |
| 4,434,114 | 2/1984 | Sprout | 264/22 |
| 4,578,442 | 3/1986 | Ohigashi et al. | 264/22 |

FOREIGN PATENT DOCUMENTS 57-123603 8/1982 Japan .
2121810 5/1983 United Kingdom .

OTHER PUBLICATIONS

Japanese Journal of Applied Physics, vol. 21, No. 8, pp. L 455–L 457 (Aug., 1982), Ohigashi et al.
Japanese Journal of Applied Physics, vol. 23, No. 9, pp. L 671–L 673, (Sep., 1984), Yamauchi et al.
Applied Physics Letters 43 (9) Nov. 1, 1983, pp. 834–836, Kimura et al.

Primary Examiner—Jeffery Thurlow

[57] ABSTRACT

A nonfibrous, unoriented sheet of a copolymer resin of about 65 to 85 mol percent of vinylidene fluoride and from 15 to about 35 mol percent of at least one other copolymerizable substituted monoolefinic monomer, said sheet having improved and uniform piezoelectric properties for hydrophonic use, and the process for preparing said sheet with improved piezoelectric and dielectric breakdown strength properties wherein it is heated for at least about 20 minutes within the temperature range of above the crystalline melting temperature and below a defined temperature, cooled to below the Curie temperature and then electrically poled, are disclosed herein.

6 Claims, 7 Drawing Figures

PROCESS OF PREPARING NONFIBROUS, PIEZOELECTRIC POLYMER SHEET OF IMPROVED ACTIVITY

BACKGROUND OF THE INVENTION

This invention relates to a nonfibrous, unoriented piezoelectric copolymer resin sheet having improved hydrophonic properties which properties are thermally stable. More particularly, it relates to an unoriented, unstretched, nonfibrous, electrically polarized sheet of a copolymer resin of about 65 up to 85 mol percent of vinylidene fluoride and 15 to about 35 mol percent of at least one copolymerizable substituted monolefinic monomer, said sheet having a combination of piezoelectric properties making it highly desirable in hydrophonic applications. In addition, this invention relates to the process of preparing said sheet wherein it is heated at high temperatures for a prolonged time period to improve its dielectric breakdown strength and piezoelectric properties which are imparted when the sheet is poled.

STATEMENT OF THE INVENTION

The product of this invention is a nonfibrous, unoriented, piezoelectric sheet having a thickness of at least about 25 micrometers ($\mu$m) and comprising a copolymer resin of about 65 to 85 mol percent vinylidene fluoride and from 15 to about 35 mol percent of at least one other copolymerizable substituted monoolefinic monomer having from 2 to 4 carbon atoms in the olefinic chain, said sheet being electrochemically homogeneous and having a transverse g coefficient which is substantially isotropic in the plane of said sheet, a hydrostatic coefficient ($g_h$) of magnitude at least 0.100 V·m/N, a dielectric dissipation factor (tan $\delta$) of less than 0.020 at 1 kHz and 20° C., and a ferroelectric to paraelectric Curie temperature ($\uparrow T_c$) of over 90° C. as obtained on the second heating when subjected to differential scanning calorimetry at a rate of 10° C./minute.

The piezoelectric response, achievable from a poled sheet which has been formed by conventional short duration heat processing methods, is insufficient for the piezoelectric sheet's intended application. Furthermore, the sheets have low dielectric strength. Unexpectedly it has been found that improvements can be made in both these areas by additional heat processing during the forming of the sheet prior to polarization. However, if the heat treatment is excessive (both in time and temperature), property degradation instead of improvement will occur.

The process of this invention comprises heating a copolymer resin sheet, as described above for the product, to a temperature within the range of above the crystalline melting temperature ($T_m$) and below the defined temperature ($T_d$) of said sheet for a time period of at least 20 minutes. After heat treatment, the sheet is cooled to at least below the Curie temperature ($T_c$) of said resin and then electrically poled in a direct current or ionic electric field.

DEFINITIONS

Figure 1:
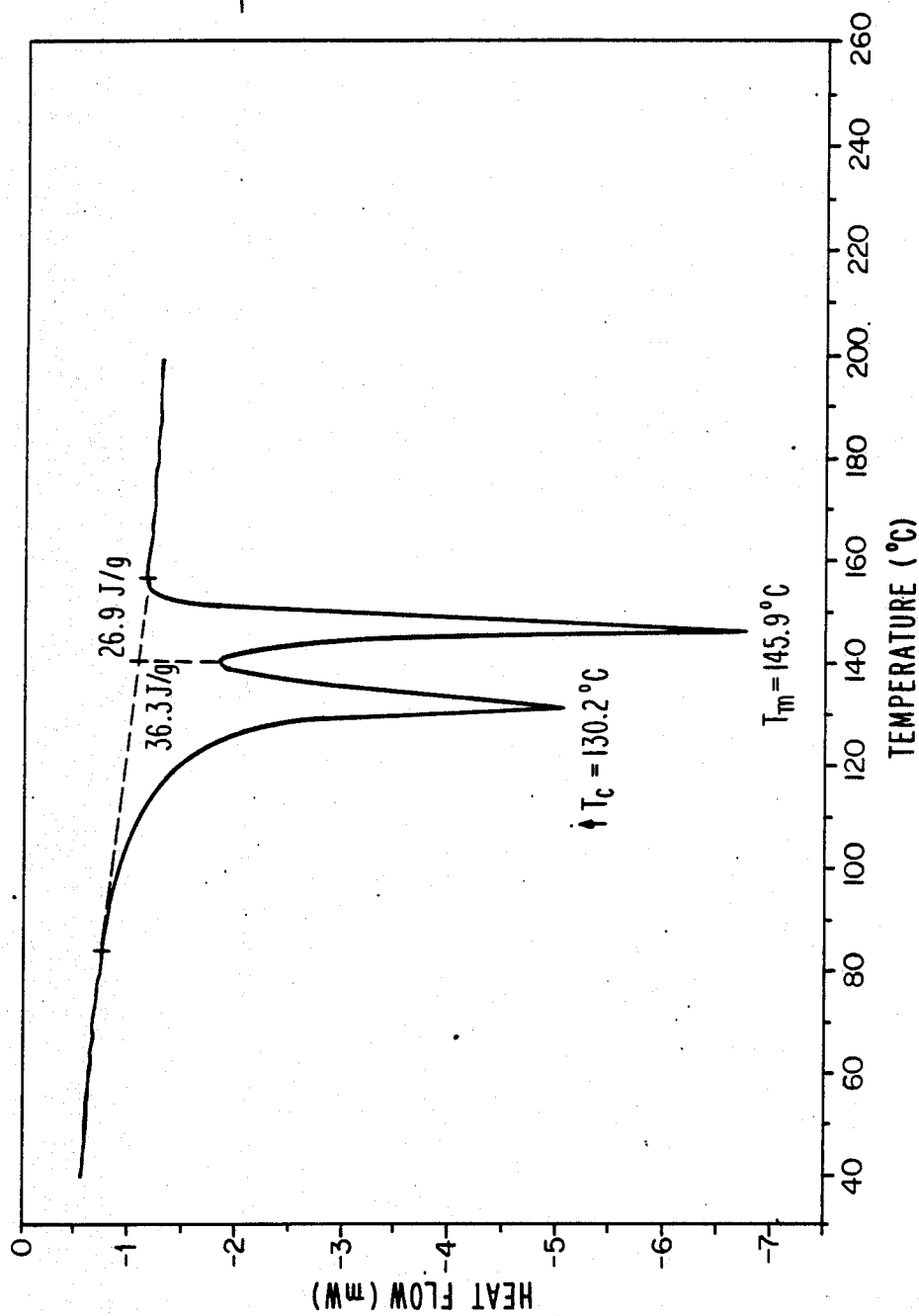
FIG. 1 shows the DSC Heating Endotherm obtained on second heating (after thermal removal of processing history) at 10° C./min for a copolymer of vinylidene fluoride/trifluoroethylene (VF$_2$/VF$_3$) having an 80/20 mole ratio.

For the purposes of this invention the following terms have the definitions set forth below.

Hydrostatic coefficient $g_h$ is the sum of $g_{31}$, $g_{32}$ and $g_{33}$ where the first numerical subscript identifies the axis of polarization or applied electrical field and the second numerical subscript indicates the axis of applied mechanical stress or strain. The 1, 2 and 3 designations are directions which correspond to the Cartesian coordinates x, y and z of a three dimensional sheet where x and y are directions lying in the major plane of the sheet and running perpendicular to each other while z is the direction extending perpendicular to the plane of the sheet and to the x and y axes.

$g_{31}$ is the applicable value for mechanical stress (either tensile or compressive) applied in the (1) direction or x axis of the piezoelectric sheet resulting in an electrical field developed in the (3) direction or z axis.

In the sheets of this invention, which are always unoriented and unstretched, the value of $g_{32}$ is the same as the value of $g_{31}$. $g_{32}$'s definition differs from that of $g_{31}$ only in that the mechanical stress is applied in the (2) direction or y axis of the sheet.

$g_{33}$ is the applicable value for mechanical stress applied in the (3) direction (normal or perpendicular to the plane of the sheet) resulting in an electrical field developed in the (3) direction.

For these piezoelectric sheets, the sign of $g_{31}$ and $g_{32}$ is positive while the sign of $g_{33}$ is negative. $g_{33}$ always dominates over the sum of $g_{31}$ and $g_{32}$ so that $g_h$ is always a negative value.

The g coefficient values are expressed as the electric field (electrical potential in volts divided by the distance in meters, m, between test electrodes, i.e. the sample thickness, t) divided by the applied stress (Pascals=N/m², the applied force per unit area), or dimensionally, V·m/N. $g_{31}=g_{32}$ is measured by monitoring the electrical output of a strip of piezoelectric sheet which is sinosoidally vibrated at 10-100 Hz using a mechanical shaker whose force output is monitored by a force transducer; $g_h$ is measured in an oil-filled cell wherein the hydrostatic pressure is sinosoidally generated by an electrically driven speaker and one monitors the electrical output from the sample and the pressure on the medium with a commercial, calibrated quartz pressure transducer.

The electromechanical coupling factor, $k_t$, is an expression of the ability of piezoelectric material to exchange electrical for mechanical energy or vice versa. $k_t$ is defined by the formula $$k_t = \left( \frac{e_{33}^2}{c_{33}^D \cdot \epsilon_{33}^S} \right)^{\frac{1}{2}}$$

wherein $e_{33}$ is a piezoelectric stress constant, $c_{33}^D$ is an elastic constant under constant electric displacement, D (open circuit condition), $\epsilon_{33}^S$ is a dielectric constant under a constant strain, S, and the suffix 33 means that the 3 direction or z axis is parallel both to the direction of developed mechanical stress and to the electric field applied to a sample sheet of the copolymer resin of this invention. The value of $k_t$ is obtained by analyzing the frequency characteristics of the electric admittance, Y, in the vicinity of the resonance point, (with sound velocity $\approx 2$ km/sec.) $f_o \approx [t(mm)]^{-1}$ MHz, (i.e., frequency in MHz for thickness in millimeters) of a rectangular cut sample of the copolymer resin sheet while applying a high frequency voltage ($\frac{1}{2}f_o \leq f \leq 2f_o$) onto the sample sheet [Jour. Applied Physics, 47 (3) 949-955 (1976)]. In general, the $k_t$ of the sheets of this invention is at least about 0.25 and frequently at least 0.28.

The dielectric dissipation factor, tan δ, represents the ratio of the electrical frictional heat loss $\epsilon''$ to the dielectric constant $\epsilon'$ of a piezoelectric material. Tan δ and the capacitance [$C=\epsilon \cdot$(Sample area)$\div t$] are measured on a dielectric bridge.

The crystalline melting temperature ($T_m$) for the piezoelectric resins of this invention is represented by the highest temperature major peak ($T_m$ peak) in the melting endotherm curve produced for a sample of the resin when subjected to differential scanning calorimetry (DSC) at the rate of 10° C./min. The same endothermic curve also serves to identify the ferroelectric to paraelectric Curie temperature $\uparrow T_c$ of the polymer specimen. The $\uparrow T_c$ endothermic peak is nearest to and on the low temperature side of the $T_m$ peak of said polymer.

The companion crystallizing temperature ($T_x$) for the resin is represented by the highest temperature major peak ($T_x$ peak) in the cooling exothermic curve produced for a sample of the now melted resin when subjected to cooling DSC at the rate of 10° C./min. This exothermic curve also serves to identify the paraelectric to ferroelectric Curie temperature $\downarrow T_c$. The $\downarrow T_c$ exothermic peak is nearest to and on the low temperature side of the $T_x$ peak of said polymer.

Figure 2:
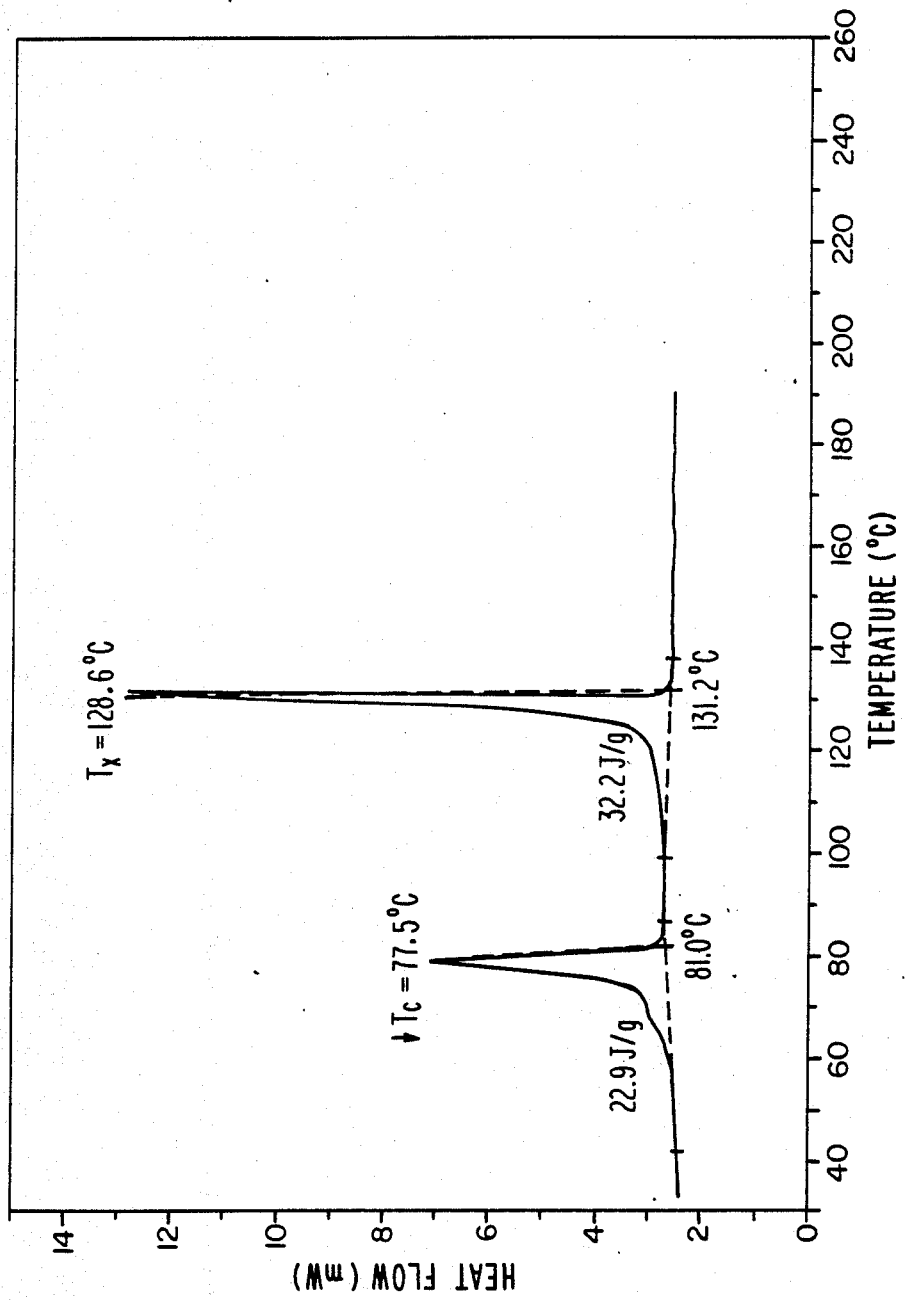
FIG. 2 shows the DSC Cooling Exotherm obtained by cooling at 10° C./min after first heating to 210° C. for a copolymer of VF$_2$/VF$_3$ having mole ratio 80/20.

Typical corresponding DSC heating and cooling thermograms are given in FIGS. 1 and 2, respectively, for a copolymer with nominal 80/20 mol ratio VF₂/VF₃. From FIG. 1 we see $T_m=145.9°$ C., $\uparrow T_c=130.2°$ C.; while from FIG. 2 $T_x=128.6°$ C. and $\downarrow T_c=77.5°$ C.

The degradation temperature, $T_d$, of a piezoelectric resin sheet is defined for the purpose of this invention as a temperature whereby if the formed sheet is held for 20 minutes or greater at $T \geq T_d$, the dielectric strength and achievable piezoelectric properties are diminished rather than improved relative to its untreated state (sheet treated by conventional casting or short term heat processes). The $T_d$ has been found to be considerably more than 50° C. above $T_m$.

DETAILED DESCRIPTION OF THE INVENTION

The piezoelectric copolymer resin sheet of this invention is prepared from a copolymer resin of from about 65 to 85 mol percent vinylidene fluoride (VF₂) and from 15 to about 35 mol percent of at least one other copolymerizable substituted monoolefinic monomer having from 2 to 4 carbon atoms in the olefinic chain. Examples of such monoolefins are ethylene, propylene and butylene. The substituent groups on the monoolefin are preferably halogen, e.g., fluorine, chlorine, bromine and mixtures of these atoms and most preferably fluorine atoms but, alternatively, substituents including acid, ester (acrylate, methacrylate) nitrile, pyridine, pyrrolidone, alkyl, phenyl and alkyl substituted phenyl groups and the like may be employed. Preferred comonomers of this invention are trifluoroethylene, tetrafluoroethylene, vinyl fluoride, vinyl chloride, hexafluoropropene, trifluorochloroethylene and acrylonitrile. The most preferred comonomers are trifluoroethylene (VF₃) and tetrafluoroethylene (VF₄). Terpolymer systems are included within the scope of the copolymers of this invention. For example, terpolymers of vinylidene fluoride, trifluoroethylene and tetrafluoroethylene or terpolymers of vinylidene fluoride, trifluoroethylene and vinyl fluoride are included. A small proportion of ethylene (2-3%) may be incorporated in the terpolymer without detriment to the piezoelectric properties of the resulting sheet. In the preferred embodiment, vinylidene fluoride is present in the copolymer resin in an amount of from 67 to 82, more preferably 70 to 82, most preferably 76 to 82 mol percent, to obtain acceptable thermal stability and an acceptable level of the piezoelectric sensitivity. On the other hand, maximum piezoelectric sensitivity is achieved with an acceptable thermal stability when the copolymer contains vinylidene fluoride in a mol percentage in the lowest amount of the given range. The above ranges for vinylidene fluoride content in the VF₂/VF₃ copolymer resin were chosen because the ferroelectric to paraelectric Curie temperature, ($\uparrow T_c$) prior to poling, as measured in the second heating run during a DSC procedure, is approximately 70° C. for copolymers with vinylidene fluoride content 45 to 65 mol %, and about 100° C. for 67 to 69 mol %, and 110° C. for 70 to 75 mol %, and approximately 132° C. for 79 to 82 mol %. For the VF₂/VF₄ copolymer resin, $\uparrow T_c$ is approximately 100° C. for VF₂ content 75 mol % and about 125° C. for VF$_2$ content approximately 80 mol %.

Figure 3:
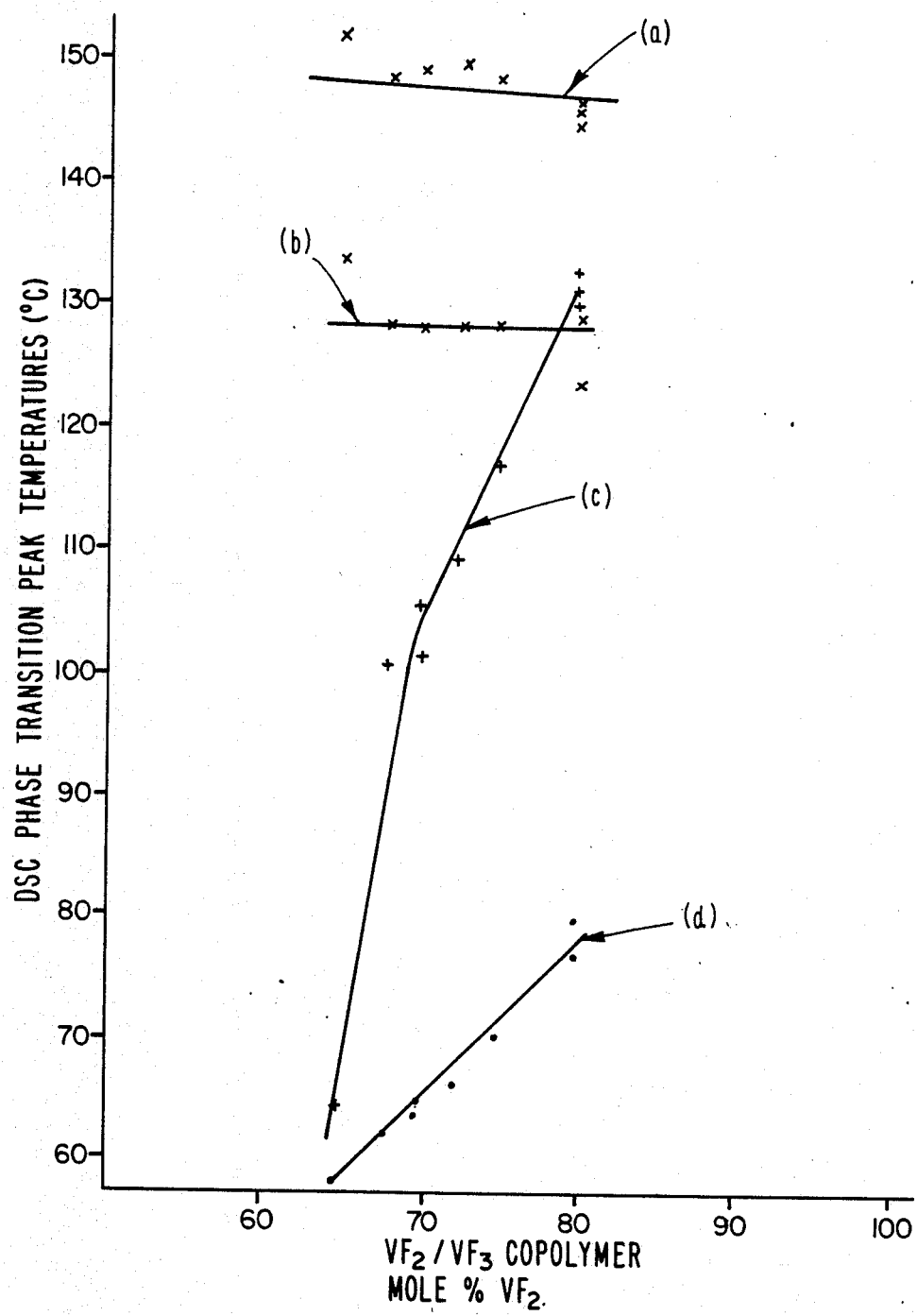
FIG. 3 shows the DSC phase transition peak temperatures (after first heating to 210° C.) corresponding to (a) the melt $T_m$, (b) the crystallization $T_x$, (c) the ferroelectric to paraelectric crystalline (Curie) phase transition $\uparrow T_c$, and (d) the paraelectric to ferroelectric crystalline (Curie) phase transition $\downarrow T_c$ versus VF$_2$/VF$_3$ copolymer mole ratio within the range of from 65/35 to 80/20.

In FIG. 3 the peak temperatures of the heating and cooling thermographs are summarized according to the nominal VF$_2$/VF$_3$ mole ratios from 65/35 to 80/20. It should be noted that while the crystalline melting temperatures T$_m$ (heating) and the crystallizing temperatures T$_x$ (cooling) remain in the same range (T$_m$~150° C., T$_x$~130° C.), the heating Curie temperature ↑T$_c$ (ferroelectric to paraelectric transition) and the cooling Curie temperature ↓T$_c$ (paraelectric to ferroelectric transition) vary substantially as the mole ratio is changed.

Figure 4:
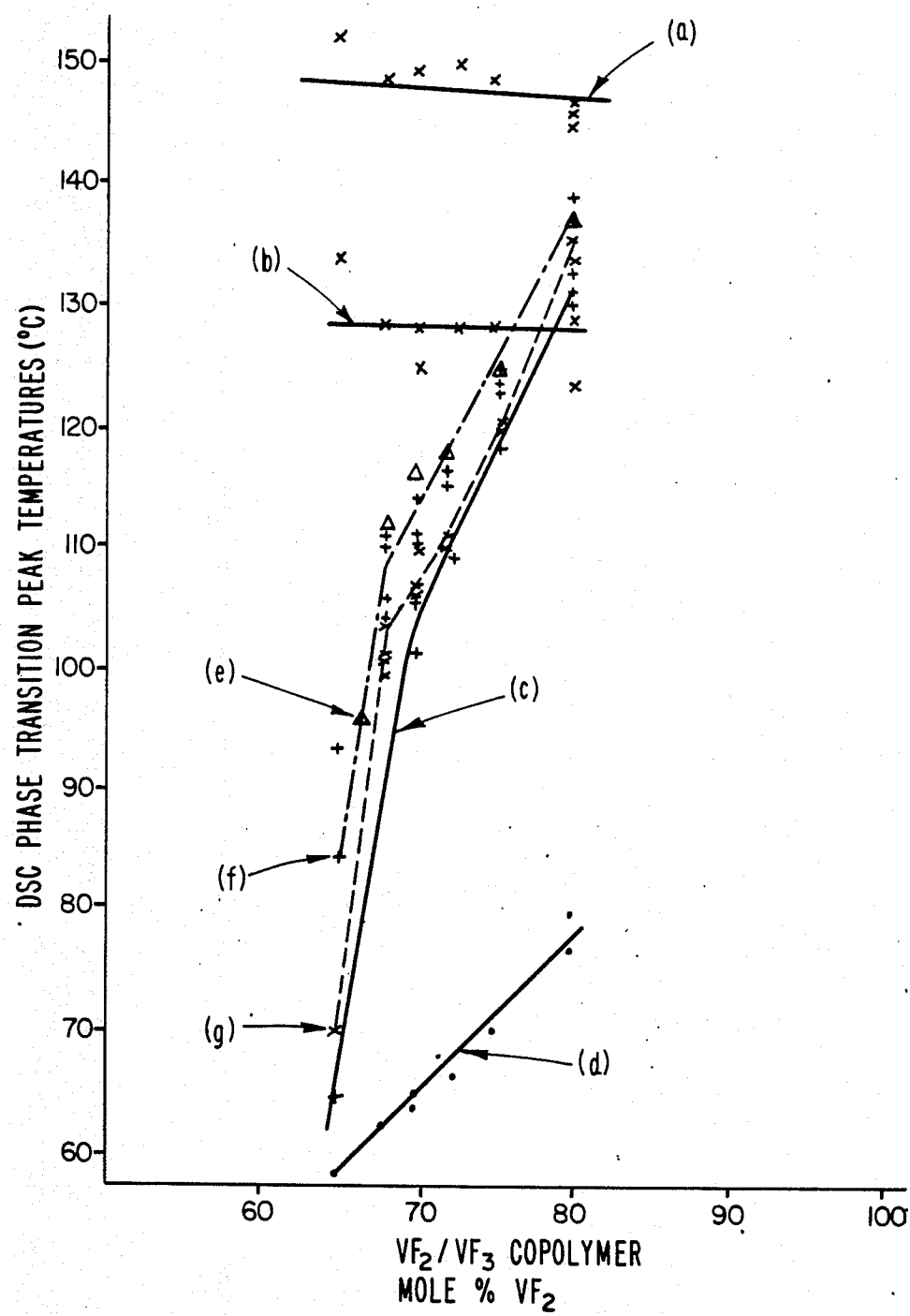
FIG. 4 shows the DSC phase transition peak temperatures of FIGS. 3(a)-(d) plus three curves of paraelectric to ferroelectric crystalline $\uparrow T_c$'s corresponding to treated copolymer sheets, viz: (e) short term processing (unpoled $\uparrow T_c$), heat-treated according to this invention ((f) poled $\uparrow T_c$, and (g) unpoled $\uparrow T_c$) versus VF$_2$/VF$_3$ copolymer mole ratio within the range of from 65/35 to 80/20. Note curves (e) and (f) coincide.

The sheets of copolymer produced according to this invention can be characterized further by changes in the DSC peak associated with the crystalline Curie transition. FIG. 4 shows that there is an increase in the ↑T$_c$ of materials heat treated according to this invention [curve (g)] over the same material which is free of heat treatment history [second heating ↑T$_c$, curve (c)]. However, it is less than the ↑T$_c$ observed on the less easily poled materials obtained by the ordinary quick processing methods of extrusion, injection molding, compression molding, etc. [curve (e)]. It should be noted that the ↑T$_c$'s of the poled materials [curve (f)] of this invention are increased over that of their unpoled counterparts [curve (g)].

Figure 5:
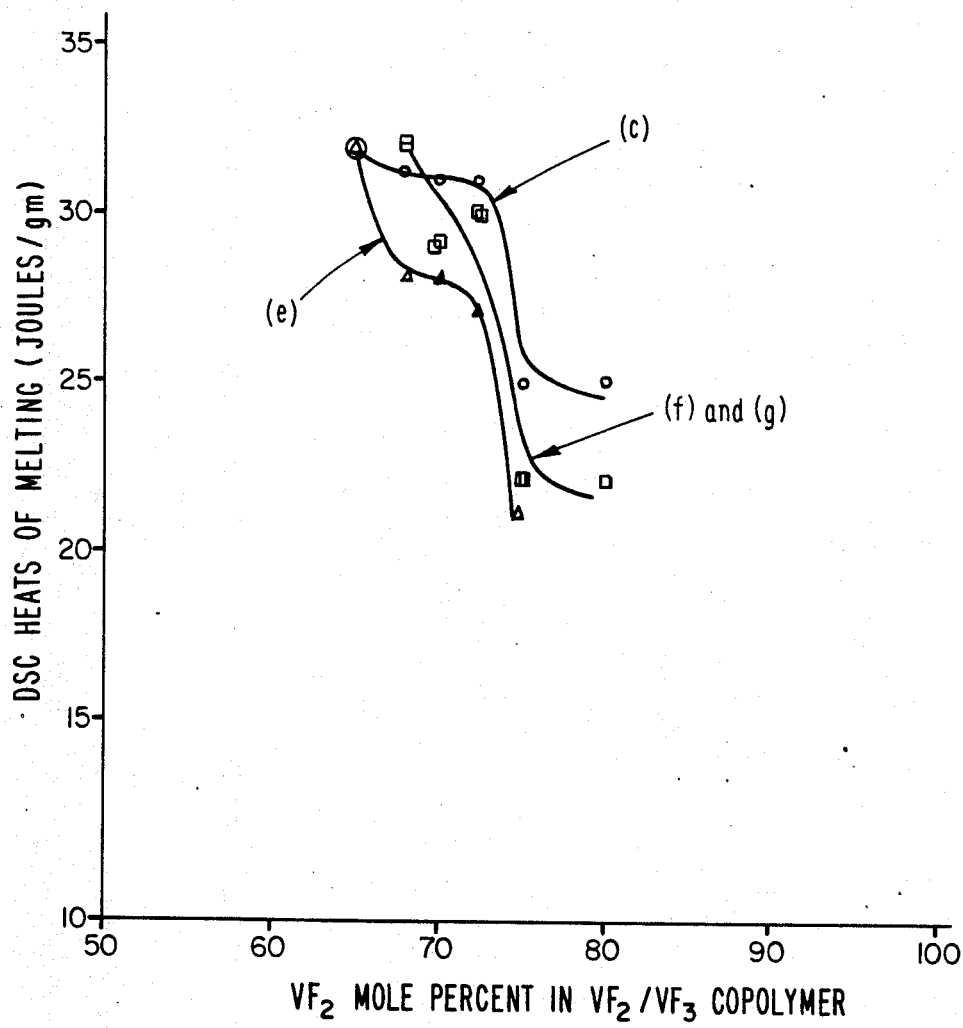
FIG. 5 shows the DSC Heats of Melting taken from DSC heating thermograms for (c) second heating of sheets, (e) short-term processed (unpoled) sheets, (f) and (g) poled and unpoled sheets heat-treated according to this invention [curves (f) and (g) generally coincide].
Figure 6:
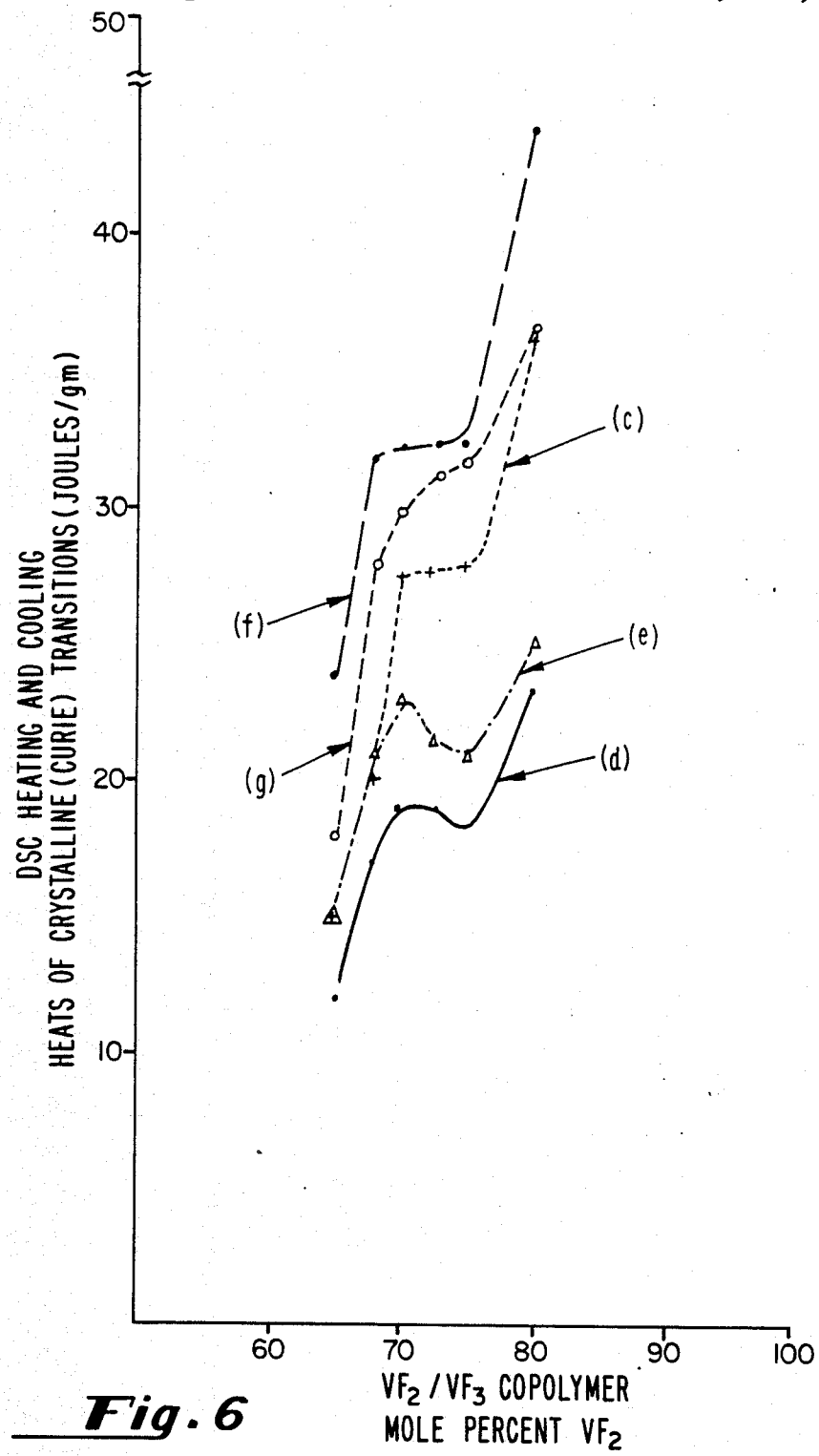
FIG. 6 shows the Heating and Cooling Crystalline (Curie) Heats of Transition taken from DSC heating and cooling thermograms; (c) through (f) correspond to the same labels as in FIG. 4; i.e., (c) second heating ferroelectric to paraelectric transition, (d) cooling (after first heating to 210° C.) paraelectric to ferroelectric transition, (e)-(g) first heating showing heats associated with ferroelectric to paraelectric transition for: (e) short-term processed (unpoled) sheets, heat-treated according to this invention [(f) poled, and (g) unpoled] versus VF$_2$/VF$_3$ copolymer mole ratio within the range of from 65/35 to 80/20.

The heats of melting as shown in FIG. 5 also indicate the effect of the heat treatment of this invention. While there is not an increase in total crystallinity relative to the second heating DSC run [compare curves (f) and (g) with curve (c) in FIG. 5], a greater heat of transformation is associated with the solid state ferroelectric to paraelectric crystalline transition [FIG. 6, (f) and (g) compared with (c)]. It should be noted that the heats of melting and the heats of crystalline transformation of the usual quick processed material [curve (e) in FIG. 5 and FIG. 6, respectively], are less than any other process.

The usual quick processing produces lesser amounts of ferroelectric crystals (higher ↑T$_c$) which do not pole as well as the lower ↑T$_c$ ferroelectric crystals occuring in the treated unpoled material. Lesser crystallinity is indicated by reduced melting (FIG. 5) and reduced ferroelectric to paraelectric crystalline (FIG. 6) endothermic heats of transition. On the other hand, processing according to the heat treatment of this invention results in higher crystallinity material compared with quickly processed material [FIGS. 5 and 6, (f) and (g) compared with (e)]. From FIGS. 4 and 6 [comparing (f) with (g)], we see that poling has the effect of increasing the amount of the ferroelectric crystalline phase (the ↑T$_c$'s and the heats of crystalline transformation are both increased).

The copolymer resins of this invention are prepared by any convenient procedure including, for example, suspension or emulsion polymerization techniques well known in the art. A preferred method is disclosed in U.S. Pat. No. 4,360,652.

The preform sheets of this invention are fabricated by solvent casting, or by short duration heat processing methods such as melt extrusion, injection molding, pressing, or calendaring. Such forming techniques are so well known that they need not be specifically described here.

The preformed sheet at the time of fabrication or thereafter is subjected to a heat treatment within the range of above the crystalline melting temperature (T$_m$) to below the degradation temperature (T$_d$) of the particular copolymer resin sheet for a time period of at least 20 minutes. The preferred temperature for this treatment ranges from about 145° to about 200° C., depending upon the molar ratio of the copolymer components, and the preferred time period ranges from about 30 minutes to about 2 hours. Generally speaking, the lower the temperature within the given range, the longer the treatment time required for optimum results. The sheets are conveniently heat treated on a surface having retaining side walls which prevents such sheets from distorting.

The sheets of this invention are usually electroded by coating, laminating, or otherwise, on one or both surfaces with an electroconductive layer including, for example, copper, aluminum, chromium, zinc, tin, nickel, silver, gold, or other electroconductive material. The coatings are applied, for example, by vacuum deposition, electroplating, spray painting, sputtering, laminating and the like. Such coatings provide an intimate electrical contact over an area of the piezoelectric sheet and form an important mechanical as well as electrical component of the transducer whereby the sheet can be utilized in various applications. For example, when used in hull mounted hydrophones it is preferable that the electrode coating effectively increases the transverse, "in-the-plane", stiffness so that the effective g$_h$ is enhanced and the g$_{31}$ coefficient is diminished. This can be achieved through appropriate selection of the electrode material modulus and control of its thickness. Masking can be used during coating deposition to achieve complex electrode patterns on the sheets.

The sheets are polarized either before or after electroding. This may be accomplished by subjecting them to an intense, direct current, or ionic electric field. Poling is preferably accomplished at room temperature but can also by carried out at any temperature below the Curie temperature of the resin from which the sheet is fabricated (The electric field can be applied at temperatures above ↑T$_c$; but to obtain permanent polarization, the field must be maintained as the sheet is cooled below ↓T$_c$). Typical poling conditions for the sheets of this invention involve application at room temperature of a monopolar field cycling between zero and a maximum amplitude of approximately 100 to 125 volts per micrometer of sheet thickness, each cycle lasting for several seconds to several minutes, the field increasing and decreasing at a constant rate. However, other poling conditions or procedures utilizing higher and lower voltage for shorter or longer time periods, or by bipolar fields, or ionic electric fields can be used as long as the integrity of the sheet is maintained.

The hydrostatic coefficient g$_h$ is a measure of the hydrostatic piezosensitivity of a copolymer resin sheet. A −g$_h$ with magnitude of at least 0.100 V·m/N and preferably 0.150 V·m/N is attained with the process of this invention. Simultaneously, the piezoactivity of the sheets demonstrate stability at temperatures above 90° C. since the Curie temperature, ↑T$_c$ of the copolymer resin after poling is above 115° C. and preferably above 130° C.

The temperature coordinates of the peak area associated with the ferroelectric to paraelectric transition in the DSC thermogram identify the temperature range over which the ferroelectric to paraelectric transition takes place. The peak area curve consist of a leading edge, a central peak area which contains the characterizing temperature peak, and a trailing edge. The curve provides information regarding the extent of such a transition as the temperature is increased.

Figure 7:
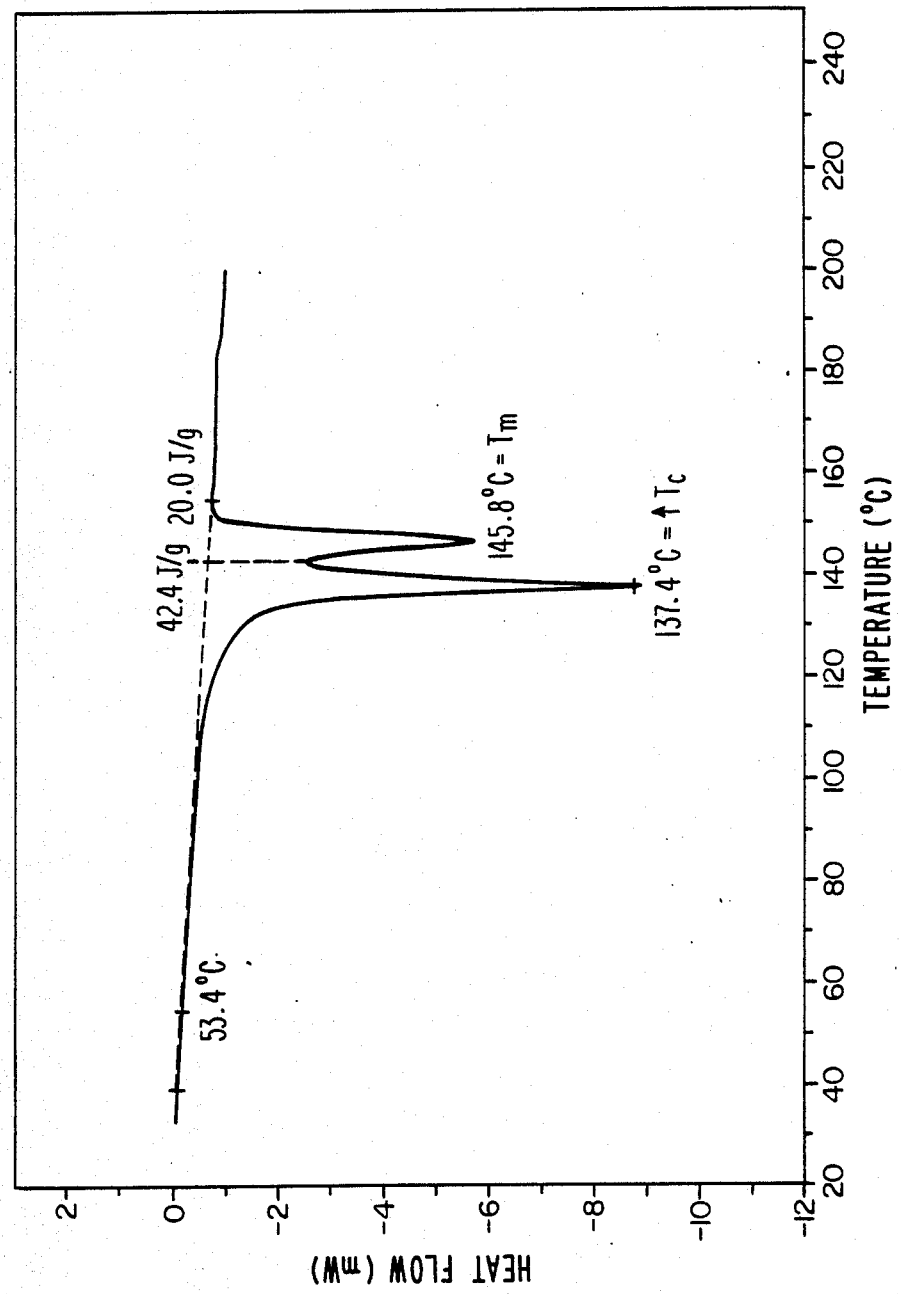
FIG. 7 shows the DSC Heating Endotherm obtained on first heating at 10° C./min for a polarized copolymer of VF$_2$/VF$_3$ having an 80/20 mole ratio.

As the ferroelectric thermal stability is determined by the integral content of the peak area, any thermal treatment which may reach through only a portion of the leading edge of the transition will be sufficient to reduce the piezoactivity. We have found that a 90° C. exposure for one hour will not affect the sensitivity of $VF_2/VF_3$ 80/20 mole percent copolymer. However, a similar thermal treatment at 110° C. will result in a loss of 1.5 db. In FIG. 7 is shown a DSC heating endotherm obtained on the first heating at 10° C./min of a $VF_2/VF_3$ (80/20 mole ratio) polarized copolymer. The second heating endotherm of the same material was shown in FIG. 1.

In addition to the high hydrostatic piezosensitivity and accompanying high thermal stability of the piezoelectric sheets of this invention, they demonstrate a high ability to convert electrical energy to mechanical energy and vice versa. The electromechanical coupling factor ($k_t$) is at least 0.25 and preferably at least 0.28.

Furthermore, the polarized sheets of this invention demonstrate a low dielectric dissipation factor (tan $\delta$) whereby the noise level is reduced relative to the transfer impedance to the electrical amplifier. Tan $\delta$ values of 0.012–0.014 and less are readily obtained at 1 kHz and at 20° C. with the sheets of this invention. For example, quick-processed sheets have tan $\delta \geq 0.020$; after heat treatment the tan $\delta$ typically falls to approximately 0.017; poling reduces tan $\delta$ further, in some cases to 0.010 and less. The relative dielectric constant $\epsilon/\epsilon_o$ for the evaluated unpoled materials ranged from 12.5 down to 9, the 65/35 mol% $VF_2/VF_3$ copolymer having the highest $\epsilon$ values and the 81/19 composition the lowest $\epsilon$ values. After heat treatment and polarization, all $\epsilon$ values lowered to between 8 and 9 for the 68/32–81/19 mol% range of $VF_2/VF_3$ copolymers and to 8.5 to 10.2 for the 65/35 mol % $VF_2/VF_3$ copolymer. Note that for a particular composition greater polarization results in further lowering of the dielectric constant.

The better poled material is indicated by greater $g_{33}$ absolute values. Examination of Examples 1–35 shows that the lower dielectric permitivities and losses are correlated with the higher absolute values of $g_{33}$.

The following examples are set forth to demonstrate the process and products of this invention. The examples employ sheets of copolymer resins prepared generally in accordance with the emulsion polymerization procedure of U.S. Pat. No. 4,360,652. A horizontal stainless steel autoclave equipped with a stirrer was charged with water and the ammonium salt of a perfluorooctanoate as an emulsifier. Vinylidene fluoride monomer and trifluoroethylene monomer in the required molar proportions were added to the pressurized autoclave after purging with nitrogen. The reactor was heated to the reaction temperature and the reactants were agitated. A chain transfer agent was added to the reaction after about one-fifth of the reactants had been charged to the autoclave and the reaction was initiated by the addition of diisopropyl peroxydicarbonate. Monomers, in the required molar proportions, were continuously fed into the reactor along with appropriate amounts of chain transfer agent and initiator. Each monomer's pressure was maintained constant throughout the reaction. Upon completion of the reaction (effective initiator depletion), the reactor contents were cooled and the latex product drained from the reactor. The latex was concentrated and the copolymer resin recovered as a powder. Such a powder can be pelletized by conventional methods.

The polymer (in powder or pellet form) was extruded or compression molded into non-oriented pre-form sheets of a thickness of 0.40–2.50 millimeters. Copolymers of varying mol percentages of vinylidene fluoride and trifluoroethylene or tetrafluoroethylene were used in the examples and represent those copolymers broadly disclosed herein.

EXAMPLE 1

A press molded slug of an emulsion polymerized copolymer of composition 68 mole percent vinylidene fluoride and 32 mole percent trifluoroethylene, whose $\uparrow T_c$ as indicated on second heating DSC is 100° C., was simultaneously formed into a sheet and heat treated by subjecting it to 3.5 MPa and 185° C. for one hour to form a sheet having a thickness of 400 $\mu$m. The sheet was placed in a fixture within a hydraulic press. Metal foil electrodes were impressed on opposite surfaces of the sheet. A monopolar electric field was multiple cycled (4–5 times) and stepwise increased until 50 kV was reached at the maximum. The cycling rate was 400 V/sec with a holding period of 15 seconds at the maximum attained in each cycle.

After poling and applying electroconductive silver paint coatings as surface electrodes, the sheet's piezoelectric coefficients, $g_{31}=g_{32}$ and $g_h$, were determined at room temperature. Also determined were the relative dielectric permeability $\epsilon$ [the ratio of the dielectric constant to $\epsilon_o$, the permeability of free space ($\epsilon_o=8.854\times10^{-12}$ farad/m)] and the dielectric loss, tan $\delta$ (before and after poling). The resulting values were $g_h=-0.16$ V·m/N, $g_{31}=g_{32}=0.15$ V·m/N, $g_{33}=-0.46$ V·m/N, $\epsilon(100$ Hz$)=8.8$ poled (10.0 unpoled), $\epsilon(1$ kHz$)=8.6$ poled (9.8 unpoled), tan $\delta(100$ Hz$)=0.0133$ poled (0.016 unpoled), tan $\delta(1$ kHz$)=0.0137$ poled (0.018 unpoled).

EXAMPLE 2

Using the material and procedure described in Example 1 (except that the heat treatment was 30 minutes and maximum poling voltage was 45 kV), a resulting 450 $\mu$m sheet when coated with an electroconductive silver paint had the following piezocoefficients and related dielectric properties for the poled material: $g_h=-0.11$ V·m/N, $g_{31}=g_{32}=0.16$ V·m/N, $g_{33}=-0.43$ V·m/N, $\epsilon(100$ Hz$)=8.2$, $\epsilon(1$ kHz$)=7.95$, tan $\delta(100$ Hz$)=0.0256$, tan $\delta(1$ kHz$)=0.027$.

The subsequent Examples 3–18 have electroconductive silver paint as surface electrodes.

EXAMPLE 3

Using the material and procedure described in Example 1 (except that the heat treatment was 4 hours and the maximum poling voltage was 51 kV), the resulting 400 $\mu$m sheet had the following piezocoefficients and dielectric properties: $g_h=-0.141$ V·m/N, $g_{31}=g_{32}=0.14$ V·m/N, $g_{33}=-0.416$ V·m/N, $\epsilon(100$ Hz$)=8.8$, $\epsilon(1$ kHz$)=8.7$, tan $\delta(100$ Hz$)=0.0133$, tan $\delta(1$ kHz$)=0.0142$.

EXAMPLE 4

A press molded slug of an emulsion polymerized copolymer of composition 70 mole percent vinylidene fluoride and 30 mole percent trifluoroethylene, whose $\uparrow T_c$ was 106° C. as indicated by second heating DSC, was treated as in Example 1 but with a heat exposure time of 30 minutes and 41 kV as the maximum poling voltage. The resulting 320 μm sheet after poling had the following piezocoefficients and dielectric properties: $g_h = -0.147$ V·m/N, $g_{31} = g_{32} = 0.09$ V·m/N, $g_{33} = -0.33$ V·m/N, $\epsilon(100\ Hz) = 8.8$, $\epsilon(1\ kHz) = 8.66$, tan $\delta(100\ Hz) = 0.0152$, tan $\delta(1\ kHz) = 0.0155$.

EXAMPLES 5-31

Using the same general procedure for preparing and poling sheets as described in Examples 1-4, further Examples 5-18, 19-22, and 23-31 are summarized in Table I, II, and III, respectively. The examples as listed involve several different mole ratios of $VF_2/VF_3$. All materials in Tables I–III were poled with electric fields greater than 100 V/μm. Fields up to 135 V/μm were used; but no increases in piezoactivities nor decreases in dielectric coefficients with fields higher than 100 V/μm were observed.

TABLE II-continued

| 22 | 1.0 | 0.11 | 0.17 | 0.45 |
|---|---|---|---|---|

| Example # | ε | | tan δ | | t |
|---|---|---|---|---|---|
| | 100 Hz | 1 kHz | 100 Hz | 1 kHz | (μm) |
| 19 | 8.1(8.6)* | 8.0(8.4) | 0.0113(0.0127) | 0.0129(0.0143) | 585 |
| 20 | 8.4(8.9) | 8.2(8.7) | 0.0116(0.0127) | 0.0130(0.0149) | 600 |
| 21 | 8.2 | 8.0 | 0.0103 | 0.0120 | 585 |
| 22 | 8.3 | 8.2 | 0.0102 | 0.0130 | 800 |

*unpoled sheet value in parenthesis

EXAMPLES 23-31

Table III shows examples of sheets having different types of metal electrodes [thin vacuum metallized Ni-Al (80 nm), thick silver (Ag) paint (~20 μm), and thicker copper plated (~75 μm) electrodes]. Also shown is the effect of poling on the dielectric coefficients. The effect on the piezoelectric coefficients of the different metal electrodes can be seen by comparing data in Tables I, II, and III.

TABLE I

| Example # | VF₂/VF₃ Mole Ratio | ↑Tc* (°C.) | Heat Treatment Time(hrs) | Heat Treatment Temp.(°C.) | −g_h** | g₃₁ = g₃₂ | −g₃₃ | ε 100 Hz | ε 1 kHz | tan δ 100 Hz | tan δ 1 kHz | t(μm) |
|---|---|---|---|---|---|---|---|---|---|---|---|---|
| 5 | 65/35 | 70 | 0.5 | 165 | 0.17 | 0.16 | 0.49 | 9.1 | 8.9 | 0.018 | 0.019 | 415 |
| 6 | " | " | 1.0 | " | 0.17 | 0.14 | 0.45 | 10.5 | 10.2 | 0.016 | 0.016 | 425 |
| 7 | " | " | 2.0 | " | 0.19 | 0.17 | 0.53 | 8.7 | 8.5 | 0.017 | 0.018 | 415 |
| 8 | " | " | 2.5 | " | 0.15 | 0.15 | 0.45 | 10.2 | 9.95 | 0.016 | 0.017 | 420 |
| 9 | 70/30 | 100 | 1.5 | 180 | 0.16 | 0.10 | 0.36 | 8.7 | 8.5 | 0.014 | 0.015 | 430 |
| 10 | " | " | 2.5 | " | 0.12 | 0.12 | 0.36 | 8.95 | 8.8 | — | — | 460 |
| 11 | " | " | 4.0 | " | 0.16 | 0.12 | 0.40 | 8.8 | 8.6 | 0.014 | 0.014 | 400 |
| 12 | 72.5/27.5 | 110 | 0.5 | " | 0.18 | 0.13 | 0.44 | 8.7 | 8.55 | 0.012 | 0.013 | 420 |
| 13 | " | " | 1.5 | " | 0.13 | 0.12 | 0.37 | 10.2 | 10.0 | 0.015 | 0.017 | 420 |
| 14 | " | " | 2.0 | " | 0.15 | 0.13 | 0.41 | 8.7 | 8.5 | 0.012 | 0.013 | 430 |
| 15 | 75/25 | 117 | 0.5 | " | 0.14 | 0.11 | 0.36 | 9.2 | 9.1 | 0.013 | 0.014 | 490 |
| 16 | " | " | 1.0 | 195 | 0.13 | 0.15 | 0.43 | 9.0 | 8.9 | 0.012 | 0.014 | 420 |
| 17 | " | " | 1.5 | " | 0.15 | 0.14 | 0.43 | 9.0 | 8.8 | 0.012 | 0.014 | 420 |
| 18 | 80/20 | 133 | 0.5 | 180 | 0.13 | 0.11 | 0.35 | 9.2 | 9.0 | 0.013 | 0.015 | 490 |

*Second heating DSC
**g values given in V·m/N
$g_{33} = g_h - 2g_{31}$
sheet thickness

EXAMPLES 19-22

TABLE II below summarizes the properties of 585 to 800 μm sheets of Examples 19-22 each of which consist of copolymer resin having a $VF_2/VF_3$ mole ratio of 80/20. Electrodes were vacuum metallized, 80 nanometer (nm) thick nickel-aluminum coatings.

TABLE II

| Example # | Treatment Time (hrs.)@180° C. | −g_h | g₃₁ = g₃₂ | −g₃₃ |
|---|---|---|---|---|
| 19 | 1.0 | 0.15 | 0.16 | 0.47 |
| 20 | 1.5 | 0.10 | 0.16 | 0.42 |
| 21 | 2.0 | 0.12 | 0.15 | 0.42 |

TABLE III

| Example # | VF₂/VF₃ mole % | t(μm) | Heat Treatment Time(Hrs.) | Heat Treatment Temp.(°C.) | −g_h Ni—Al | −g_h Ag paint | g₃₁ = g₃₂ Ni—Al | ε 100 Hz | ε 1 kHz | tan δ 100 Hz | tan δ 1 kHz |
|---|---|---|---|---|---|---|---|---|---|---|---|
| 23 | 68/32 | 405 | 2.0 | 180 | 0.142 | 0.181 | | 8.9(10.2)* | 8.3(10.0) | 0.011(0.015) | 0.013(0.018) |
| 24 | 70/30 | 400 | 4.0 | 180 | | 0.16 | | 8.7(10.7) | 8.6(10.4) | 0.012(0.017) | 0.014(0.017) |
| 25 | 75/25 | 630 | 1.0 | 180 | 0.11 | | 0.18 | 9.2(10.3) | 9.1(10.1) | 0.012(0.013) | 0.012(0.014) |
| 26 | 75/25 | 425 | 1.5 | 195 | | 0.15 | | 8.7(11.0) | 8.5(10.8) | 0.012(0.013) | 0.013(0.014) |
| 27 | 80/20 | 487 | 0.5 | 180 | | 0.14 | | 8.2(9.8) | 8.1(9.6) | 0.013(0.013) | 0.014(0.016) |
| 28 | 80/20 | 585 | 1.0 | " | 0.15 | | 0.19 | 7.8(9.5) | 7.7(9.2) | 0.012(0.014) | 0.013(0.016) |
| 29 | 80/20 | 810 | " | " | 0.12 | | 0.16 | 7.9(10.2) | 7.8(10.0) | 0.010(0.014) | 0.012(0.016) |
| 30 | 80/20 | 800 | " | " | 0.10 | | 0.10 | 8.3(9.1) | 8.1(8.9) | 0.013(0.014) | 0.013(0.016) |
| 31 | 80/20 | 795 | " | " | | 0.18 | 0.02 | 8.9(10.2) | 8.8(10.0) | 0.012(0.014) | 0.013(0.016) |

*unpoled sheets in parentheses.
for Example 30, an extruded (quick-processed,nonheat-treated,unpoled) sheet had the following properties: $\epsilon(100Hz)=9.6$, $\epsilon(1kHz)=9.4$, tan $\delta(100Hz)=0.020$, tan $\delta(1kHz)=0.020$.
for Example 31, the electrodes were copper plating.

EXAMPLES 32-35

Several unstretched heat-processed sheets of vinylidene fluoride/tetrafluoroethylene ($VF_2/VF_4$) copolymer of different mol % composition each having electrodes coated thereon were polarized as described herein. Their properties, measured at room temperature, are presented in Table IV. The heat treatment was 30 minutes at 180° C. Note that in the case of $VF_2/VF_4$ copolymer sheets it is advantageous to use poling fields ($E_p$) exceeding 100 V/μm since higher polarizations result.

TABLE IV

| Example # | VF$_2$/VF$_4$ mole % | ↑T$_c$* (°C.) | t(μm) | E$_p$ (V/μm) | −g$_h$ | ε 100 Hz | ε 1 kHz | tan δ 100 Hz | tan δ 1 kHz | Electrode Coating |
| --- | --- | --- | --- | --- | --- | --- | --- | --- | --- | --- |
| 32 | 81/19 | 125 | 97 | 125 | 0.142 | 7.1(9.0) | 6.9(8.7) | 0.020(0.026) | 0.017(0.022) | Copper paint |
| 33 | " | " | 84 | 195 | 0.213 | 7.0(8.5) | 6.9(8.2) | 0.011(0.030) | 0.011(0.026) | " |
| 34 | 75/25 | 103 | 87 | 172 | 0.306 | 6.2 | 6.2 | 0.012 | 0.010 | Silver paint |
| 35 | " | " | 329 | 106 | 0.128 | 8.1(10.4) | 7.9(10.2) | 0.014(0.024) | 0.010(0.017) | " |

*Second heating DSC

In contrast to the examples of Table IV, an extruded, non-heat processed, 493 μm thick, 81/19 mol % VF$_2$/VF$_4$ copolymer resin sheet coated with copper paint electrodes, upon poling at 101 V/μm yielded the following properties: −g$_h$=0.015 V·m/N, ε(100 Hz)=9.4(unpoled 9.5), ε(1 kHz)=9.2(unpoled 9.3), tan δ(100 Hz)=0.017(unpoled 0.017), and tan δ(1 kHz)=0.015(unpoled 0.015).

We claim:

1. A process for preparing a sheet having improved piezoelectric properties when electrically poled comprising heating a nonfibrous, unoriented copolymer resin sheet of at least about 25 micrometers thick and comprising about 65 to 85 mol % of vinylidene fluoride and from 15 to about 35 mol % of at least one other copolymerizable, substituted, monolefinic monomer having from 2 to 4 carbon atoms in the olefinic chain to a temperature within a range of above the crystalline melting temperature (T$_m$) and below the dielectric strength degradation temperature (T$_d$) of said sheet for a time period of at least 20 minutes whereby said sheet has improved dielectric strength and, after poling, has a hydrostatic coefficient (g$_h$) of magnitude at least 0.100 V·m/N.

2. The process of claim 1 including the step of cooling said sheet to below the Curie temperature (↓T$_c$) of the resin from which the sheet is formed and while cooling, or after cooling, electrically poling said sheet.

3. The process of claim 2 wherein the sheet comprises about 70 to 82 mol percent of vinylidene fluoride and about 18 to 30 mol percent of a copolymerizable fluorine substituted ethylene.

4. The process of claim 2 wherein the sheet is heated to a temperature within the range of 145° to 200° C. for a time period ranging from about 30 minutes to about 2 hours.

5. The process of claim 4 wherein the copolymerizable fluorine substituted ethylene is trifluoroethylene.

6. The process of claim 4 wherein the copolymerizable fluorine substituted ethylene is tetrafluoroethylene.

* * * * *